United States Patent [19]
Abe

[11] Patent Number: 5,757,707
[45] Date of Patent: May 26, 1998

[54] SEMICONDUCTOR MEMORY DEVICE

[75] Inventor: Katsumi Abe, Yokohama, Japan

[73] Assignee: Kabushiki Kaisha Toshiba, Kawasaki, Japan

[21] Appl. No.: 768,556

[22] Filed: Dec. 18, 1996

Related U.S. Application Data

[63] Continuation of Ser. No. 453,268, May 30, 1995, abandoned.

[30] Foreign Application Priority Data

May 31, 1994 [JP] Japan .................... 6-119074

[51] Int. Cl.⁶ .................................. G11C 7/00
[52] U.S. Cl. ........................... 365/203; 365/208
[58] Field of Search ................ 365/203, 230.03, 365/190, 208, 148

[56] References Cited

U.S. PATENT DOCUMENTS

| | | | |
|---|---|---|---|
| 5,068,831 | 11/1991 | Hoshi | 365/190 |
| 5,243,574 | 9/1993 | Ikeda | 365/203 |
| 5,313,434 | 5/1994 | Abe | 365/203 |
| 5,331,233 | 7/1994 | Urakawa | 365/190 |
| 5,463,584 | 10/1995 | Hoshino | 365/203 |

FOREIGN PATENT DOCUMENTS 6-12604  2/1994  Japan.

Primary Examiner—A. Zarabian
Attorney, Agent, or Firm—Banner & Witcoff, Ltd.

[57] ABSTRACT

A semiconductor memory device of this invention includes a memory cell array, a pair of input/output lines, a pair of column data lines for connecting the memory cell array to the pair of input/output lines, and resistors for capacitively dividing the pair of column data lines into a pair of bit lines and a pair of amplification lines. A sense amplifier for amplifying the potential difference between the pair of column data lines includes a restore circuit connected to the pair of bit lines and a sense circuit connected to the pair of amplification lines. Equalizers for equalizing the potential difference between the pair of column data lines are respectively arranged for the pair of bit lines and the pair of amplification lines.

21 Claims, 11 Drawing Sheets

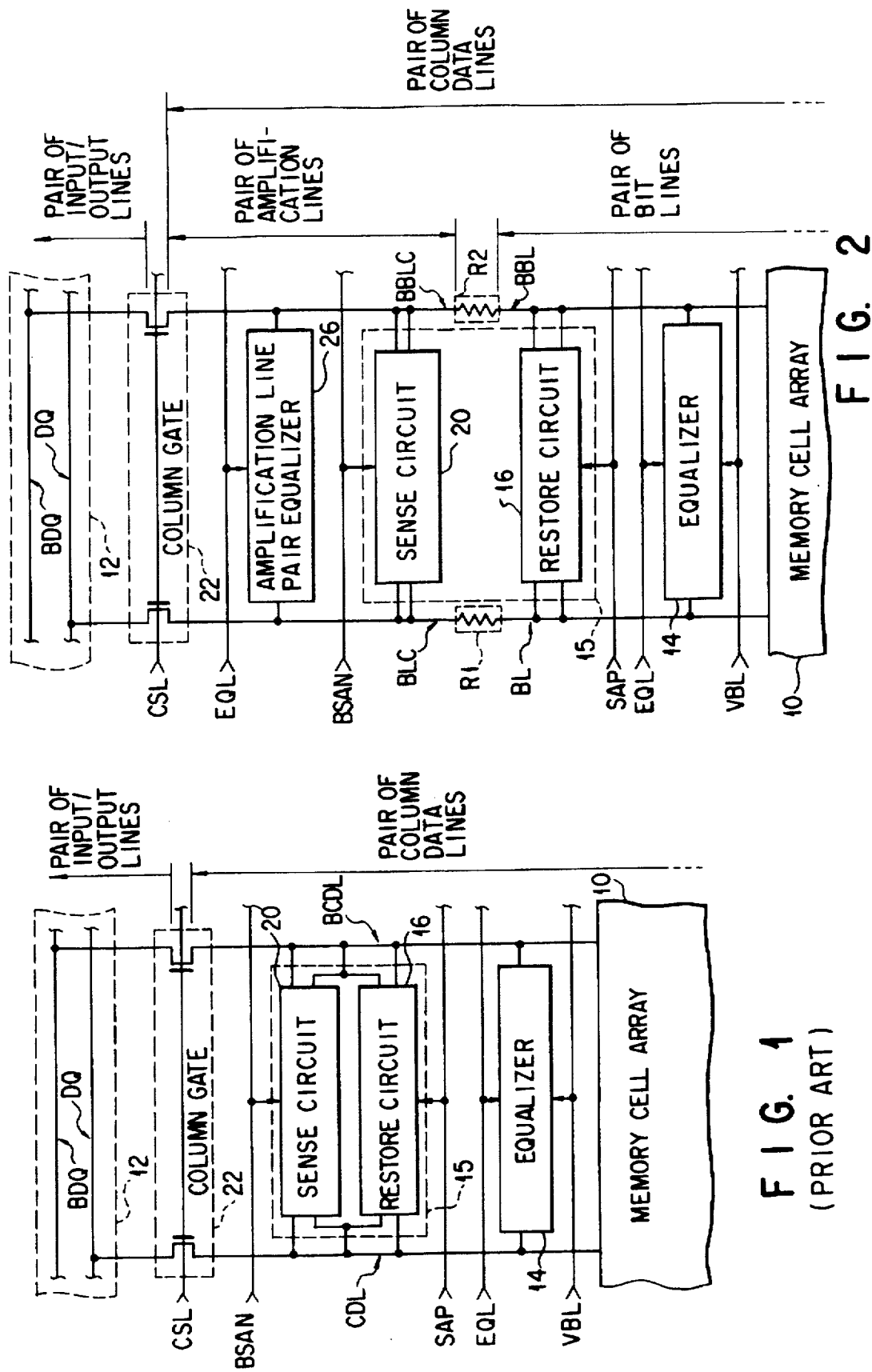

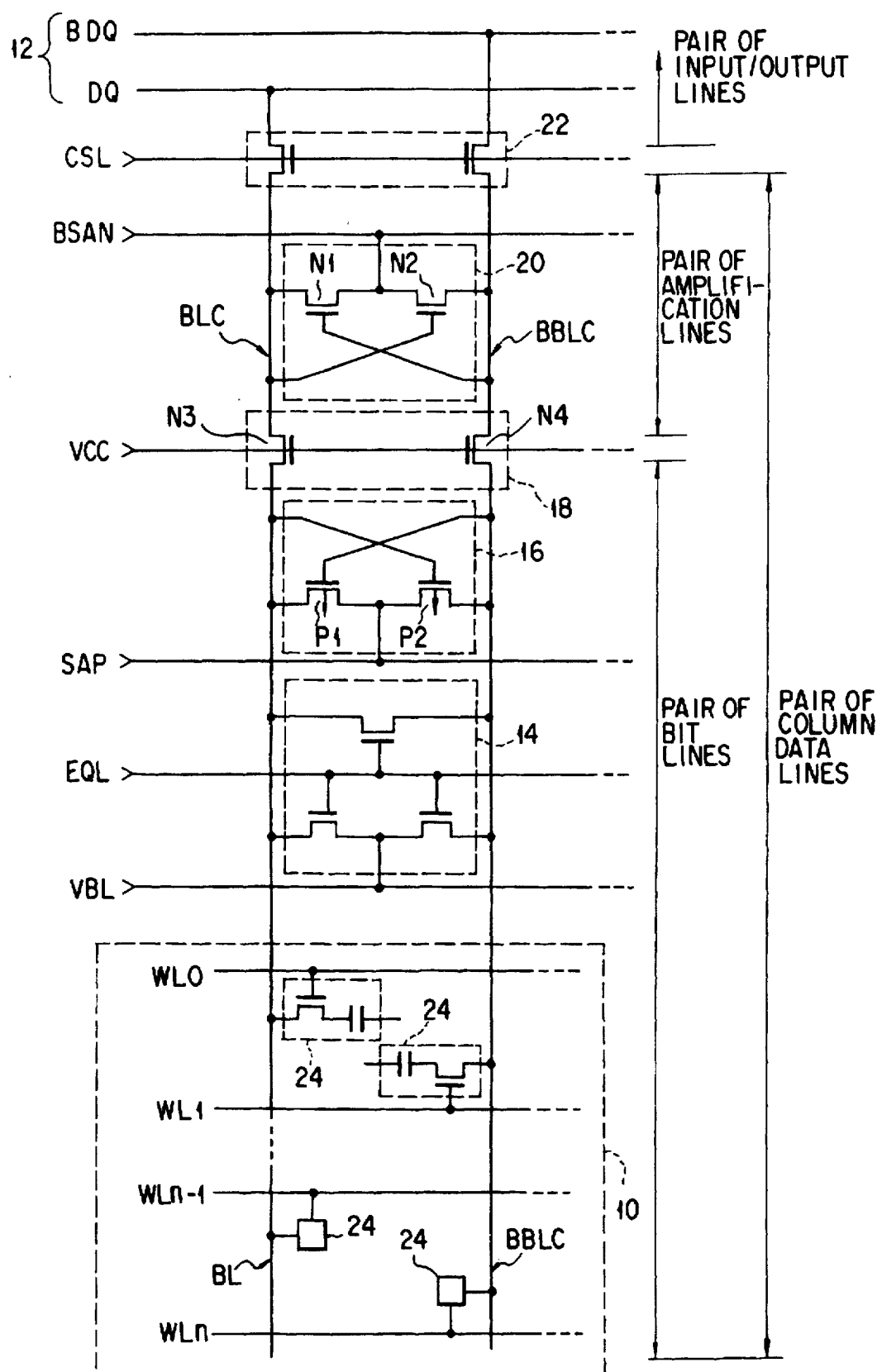
F I G. 4

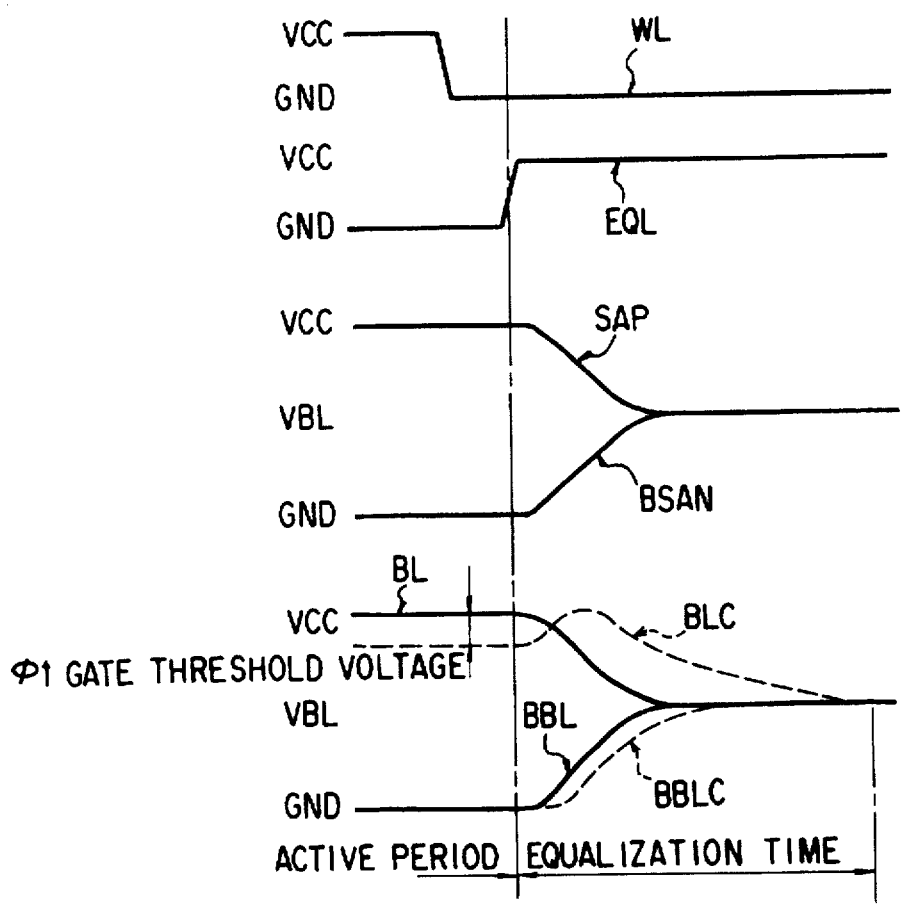
F I G. 5
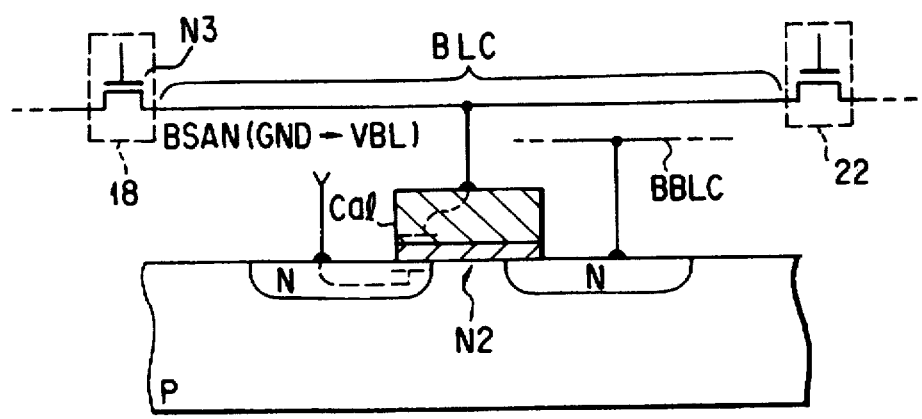
F I G. 6

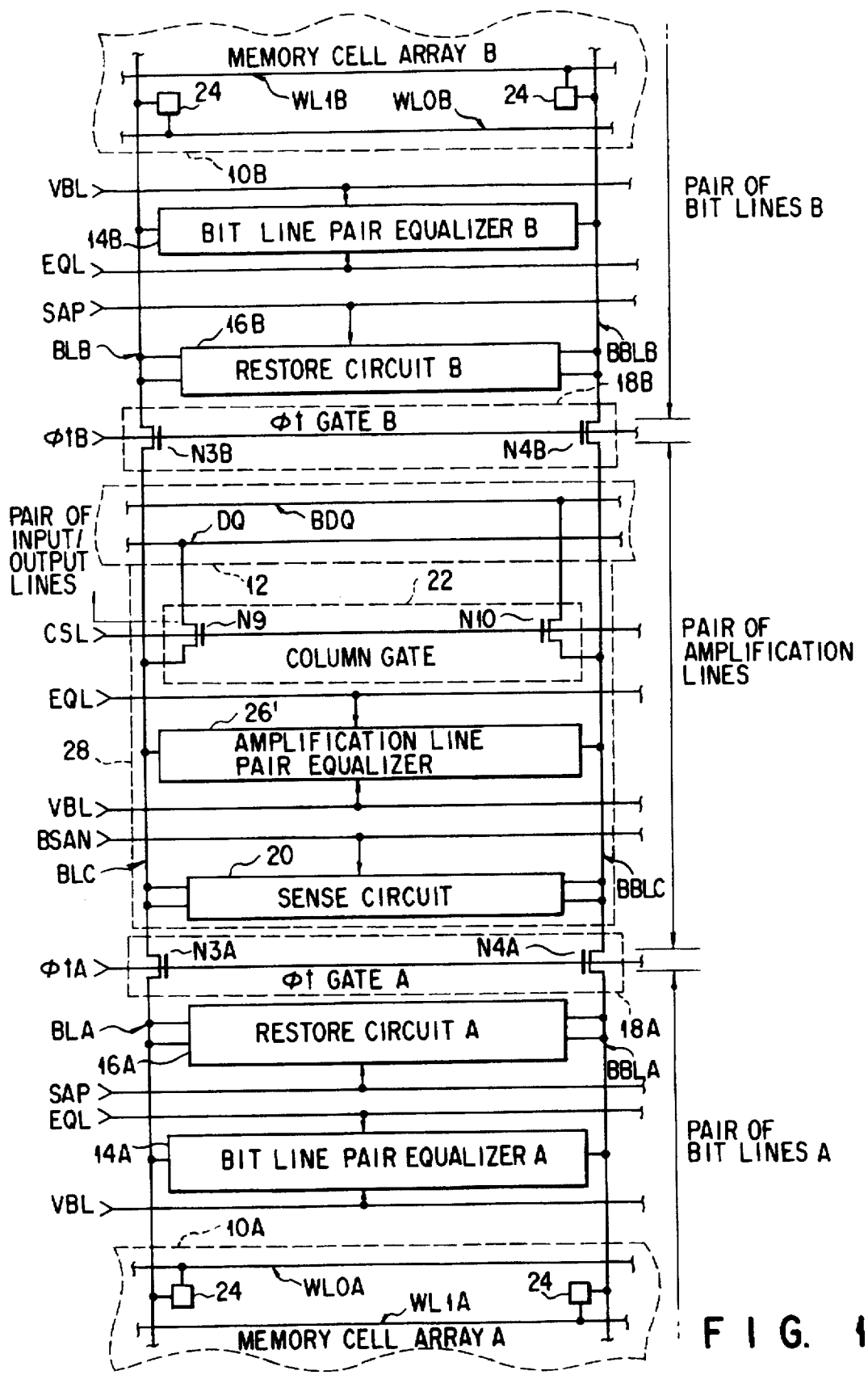
F I G. 13

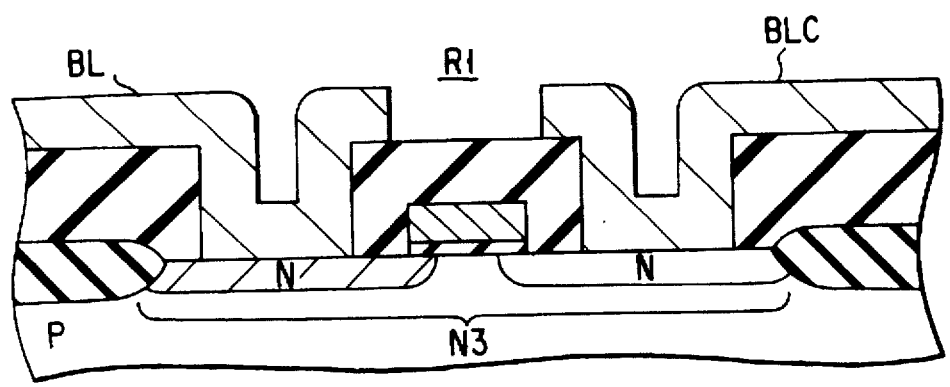
F I G. 16A
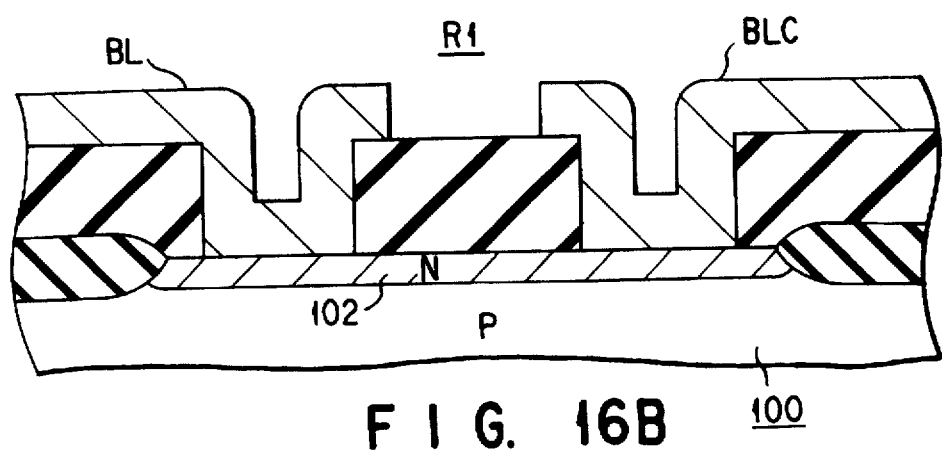
F I G. 16B
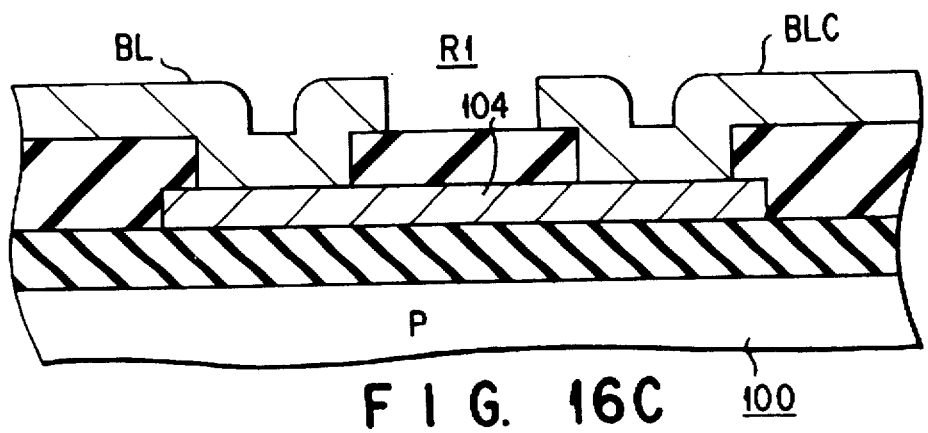
F I G. 16C

SEMICONDUCTOR MEMORY DEVICE

This application is a continuation of application Ser. No. 08/453,268 filed May 30, 1995, now abandoned.

BACKGROUND OF THE INVENTION

1. Field of the Invention

The present invention relates to a semiconductor memory device and, more particularly, to a semiconductor memory device having a bit line pair sense amplifier including a sense circuit, a restore circuit, and resistors arranged between the sense circuit and the restore circuit.

2. Description of the Related Art

FIG. 1 is a block diagram showing a conventional dynamic RAM. FIG. 1 shows a pair of column data lines which connect a memory cell array to a pair of input/output lines (DQ lines) in a dynamic RAM. A pair of column data lines are generally called a pair of bit lines. In this specification, however, the pair of bit lines will be called a pair of column data lines for the sake of easy understanding of the present invention.

As shown in FIG. 1, a pair of column data lines extend from a memory cell array 10 to a pair of DQ lines 12. In a conventional dynamic RAM, a bit line pair equalizer 14, a sense amplifier 15, and a column gate (DQ gate) 22 are sequentially connected, from the memory cell array 10 side, to the pair of column data lines. The sense amplifier 15 is constituted by a restore circuit 16 and a sense circuit 20. The bit line pair equalizer 14 equalizes the potentials of column data lines CDL and BCDL. The restore circuit 16 and the sense circuit 20 amplify a small potential difference appearing between the pair of column data lines when, for example, the data of a memory cell is read out to the equalized pair of column data lines or the data of the pair of DQ lines is input.

In the dynamic RAM having the pair of column data lines shown in FIG. 1, as the wiring capacitance of the pair of column data lines increases, the amplifying operation of the sense amplifier 15 decreases in speed for the following reason. If the wiring capacitance of the pair of column data lines is large, it takes time for the restore circuit 16 and the sense circuit 20 to raise the potential of the column data line CDL from an equalize potential VBL to the VCC level (or VSS level), or lower the potential of the column data line BCDL from the equalize potential VBL to the VSS level (or VCC level). The wiring capacitance of each pair of column data lines is very large especially in a dynamic RAM having a large storage capacity. This is because a large number of memory cells are connected to one pair of column data lines.

In order to amplify the potential difference between a pair of column data lines having a large wiring capacitance, there is proposed a scheme of connecting resistors each having a high resistance to a pair of column data lines at positions between a restore circuit and a sense circuit. With the above resistor, the pair of column data lines are divided into a small-capacitance side and a large-capacitance side. The potential difference between the pair of column data lines on the small-capacitance side is amplified earlier than the potential difference between the pair of column data lines on the large-capacitance side. As a result, the overall potential difference between the capacitance-divided pair of column data lines is amplified at a high speed.

For example, a dynamic RAM which is expected to have such an effect is disclosed in Jpn. Pat. Appln. KOKOKU Publication No. 6-12604 (Japanese Patent Application No. 62-829).

It is, however, found that in a dynamic RAM in which resistors each having a high resistance are connected to a pair of column data lines at positions between a restore circuit and a sense circuit, it takes much time to equalize the potential difference between the pair of column data lines.

SUMMARY OF THE INVENTION

The present invention has been made in consideration of the above situation, and has as its object to provide a semiconductor memory device which can shorten both the time required to amplify the potential difference between a pair of column data lines and the time required to equalize the potential difference therebetween.

In order to achieve the above object, a semiconductor memory device according to the present invention includes a pair of column data lines which are capacitively divided by resistors, and equalization circuits arranged for a pair of column data lines on the small-capacitance side and a pair of column data lines on the large-capacitance side, respectively.

In the semiconductor memory device having the above arrangement, since the equalization circuits are respectively arranged for the pair of column data lines on the small-capacitance side and the pair of column data lines on the large-capacitance side, equalization of the pair of column data lines on the small-capacitance side can be performed independently of equalization of the pair of column data lines on the large-capacitance side. For this reason, the problem of a potential rise due to capacitive coupling of the pair of column data lines can be solved, and the potentials of the pair of column data lines converge to a precharge potential at a high speed. Therefore, the time required to equalize the pair of column data lines can be shortened.

Furthermore, in the semiconductor memory device having the above arrangement, the time required to equalize the pair of column data lines on the small-capacitance side is shorter than the time required to equalize the pair of column data lines on the large-capacitance side. In such a semiconductor memory device, the speed at which the potentials of the pair of column data lines on the large-capacitance side converge to the precharge potential abruptly increases from, for example, the time point at which the potentials of the pair of column data lines on the small-capacitance side converge to the precharge potential. This is because the potentials of the pair of column data lines on the large-capacitance side are drawn to the precharge potential of the pair of column data lines on the small-capacitance side. This phenomenon further shortens the time required to equalize of the pair of column data lines.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing a conventional dynamic RAM;

FIG. 2 is a block diagram showing a dynamic RAM according to the first embodiment of the present invention;

FIG. 4 is a circuit diagram showing a dynamic RAM as a comparative example;

FIG. 5 is a timing chart showing the operation of the dynamic RAM in FIG. 4;

FIG. 6 is a sectional view showing a transistor N2 in FIG. 4;

FIG. 13 is a block diagram showing a dynamic RAM according to the third embodiment of the present invention;

FIG. 16A is a sectional view showing the first example of a resistor R in FIG. 2

FIG. 16B is a sectional view showing the second example of the resistor R in FIG. 2; and FIG. 16C is a sectional view showing the third example of the resistor R in FIG. 2.

DETAILED DESCRIPTION OF THE PREFERRED EMBODIMENTS

Figure 3:
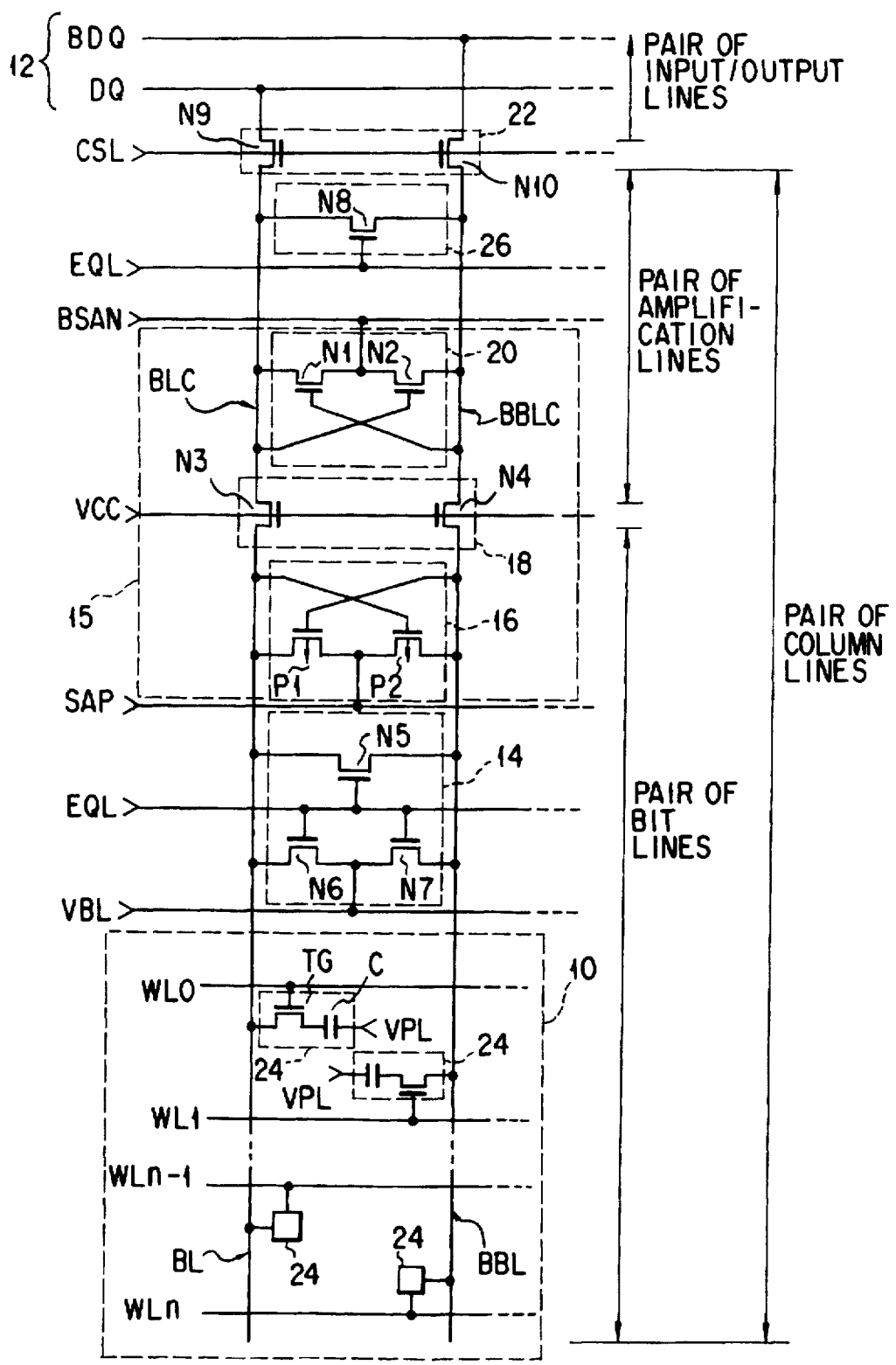
FIG. 3 is a circuit diagram showing the dynamic RAM in FIG. 2.

Embodiments of the present invention will be described below. The same reference numerals denote the same parts throughout the drawings, and a repetitive description will be omitted.

FIG. 2 is a block diagram showing a dynamic RAM according to the first embodiment of the present invention.

As shown in FIG. 2, the dynamic RAM according to the first embodiment has a pair of column data lines which connect a memory cell array 10 to a pair of input/output lines (to be referred to as DQ lines) 12. A bit line pair equalizer 14, a restore circuit 16, high-resistance portions R1 and R2, a sense circuit 20, a circuit section 26 (to be referred to as an amplification line pair equalizer hereinafter), and a column gate (to be also referred to as a DQ gate hereinafter) 22 are sequentially connected, from the array 10 side, to the pair of column data lines. The bit line pair equalizer 14 equalizes a potential difference appearing between the pair of bit lines. The restore circuit 16 differentially amplifies the potential difference appearing between the pair of bit lines. The high-resistance portions R1 and R2 include a function of capacitively dividing the pair of column data lines into a pair of bit lines and a pair of cell data amplification lines. The sense circuit 20 differentially amplifies a potential difference appearing between the pair of cell data amplification lines. The amplification line pair equalizer 26 includes a function of equalizing a potential difference appearing between the pair of cell data amplification lines. The column gate 22 electrically connects a column, selected on the basis of an external address signal, to the pair of DQ lines 12. The restore circuit 16 and the sense circuit 20 constitute the sense amplifier 15 for differentially amplifying the potential difference between the pair of column data lines.

The circuit of each block will be described next.

FIG. 3 is a circuit diagram showing the dynamic RAM according to the first embodiment of the present invention.

As shown in FIG. 3, a plurality of memory cells 24 are arranged in the memory cell array 10. One memory cell 24 is constituted by one MOS transistor "TG" (to be referred to as a cell transfer gate hereinafter) which is ON/OFF-controlled on the basis of the potential of a row selection line (to be referred to as a word line hereinafter), and one capacitor "C" for storing data.

Each cell transfer gate "TG" has a gate terminal, a drain terminal, and a source terminal. The gate terminal is connected one of word lines WL (WL0 to WLn). The drain terminal is connected to one of bit lines BL (BL or BBL). The source terminal is connected to one terminal (to be referred to as a storage node hereinafter) of the capacitor "C".

One bit line BL is paired with the other bit line, i.e., the bit line BBL, arranged in the same memory cell array. An inverted signal of a signal flowing in the bit line BL flows in the bit line BBL.

The bit line pair equalizer 14 includes three N-channel transistors N5, N6, and N7. One end of a current path of the transistor N5 is connected to the bit line BL, whereas the other end of the current path is connected to the other bit line BBL. That is, the two bit lines BL and BBL respectively serve as a source and a drain.

The drain terminal of the transistor N6 is connected to the bit line BL, whereas the source terminal is connected to a line to which a precharge potential VBL is applied. Similarly, the drain terminal and source terminals of the transistor N7 are respectively connected to the other bit line BBL and the line to which the precharge potential VBL is applied. The gate terminals of these three transistors N5, N6, and N7 are commonly coupled to each other, and a precharge signal EQL, which is set at high level during a precharge period of the dynamic RAM, is supplied to the common node.

The restore circuit 16 includes two P-channel transistors P1 and P2. The drain, gate, and source terminals of the transistor P1 are respectively connected to the bit line BL, the other bit line BLL, and a line to which a signal SAP is supplied. In this case, the signal SAP is used to activate the restore circuit 16. Similarly, the drain, gate, and source terminals of the transistor P2 are respectively connected to the other bit line BBL, one bit line BL, and the line to which the signal SAP is supplied.

A φt gate 18 includes two N-channel transistors N3 and N4. The transistor N3 is a practical example of the high-resistance portion R1 shown in FIG. 2. One end of a current path of the transistor N3 is connected to the bit line BL; and the other end of the current path, a cell data amplification line BLC. Similarly, one end of a current path of the transistor N4 is connected to the other bit line BBL; and the other end of the current path, a cell data amplification line BBLC. The gate terminals of these two transistors N3 and N4 are connected to a line to which a potential VCC is applied.

The sense circuit 20 includes two N-channel transistors N1 and N2. The drain, gate, and source terminals of the transistor N1 are respectively connected to the amplification line BLC, the amplification line BBLC, and a line to which a signal BSAN is supplied. In this case, the signal BSAN is used to activate the sense circuit 20. Similarly, the drain, gate, and source terminals of the transistor N2 are respectively connected to the amplification line BBLC, the amplification line BLC, and the line to which the signal BSAN is supplied.

The amplification line pair equalizer 26 includes one N-channel transistor N8. One end of a current path of the transistor N8 is connected to the amplification line BLC; and the other end of the current path, the amplification line BBLC. That is, the two amplification lines BLC and BBLC respectively serve as a source and a drain. The precharge signal EQL, which is set at high level during a precharge period of the dynamic RAM, is supplied to the gate terminal of transistor N8.

The column gate (DQ gate) 22 includes two N-channel transistors N9 and N10. One end of the transistor N9 is connected to the amplification line BLC; and the other end of the current path, the DQ line. Similarly, one end of a current path of the transistor N10 is connected to the amplification line BBLC; and the other end of the current path, the BDQ line. The gate terminals of these two transistors N9 and N10 are connected to a line (column selection line) to which a column selection signal CSL is supplied. In this case, the signal CSL is obtained by generating a plurality of column address signals in the a plurality a plurality of external address signals, and decoding the plurality of column address signals. When the column selection signal CSL supplied to the above line goes from the GND level to the VCC level, the column gate 22 electrically connects the pair of amplification lines BLC and BBLC to the pair of DQ lines 12.

In this case, the timing at which the potential of the column selection line goes to the VCC level is very important in terms of operation. For, if this timing is quickened too much, the pair of amplification lines are connected to the DQ line before the bit line potential is sufficiently amplified, resulting in a high possibility that data is inverted by noise at the time of connection. However, the timing is preferably quickened as much as possible, because a quicker timing will shorten the data read time. For this reason, the column gate 22 is preferably connected to the pair of amplification lines BLC and BBLC on which an initial sensing operation is performed early.

The function of the φt gate 18 will be described next.

As shown in FIG. 3, the φt gate 18 is arranged between the sense circuit 20 and the restore circuit 16. The φt gate 18 capacitively divides the pair of bit lines BL and BBL and the pair of amplification lines BLC and BBLC. The wiring capacitance of the pair of amplification lines BLC and BBLC is much smaller than that of the pair of bit lines BL and BBL. For this reason, when differential amplification is started, extraction of the charge of the pair of amplification lines BLC and BBLC is started earlier than that of the charge of the pair of bit lines BL and BBL. Therefore, a potential difference appears earlier between the pair of amplification lines BLC and BBLC than in the pair of bit lines BL and BBL.

As described above, with the φt gate 18 arranged between the φt gate 18 and the restore circuit 16, a special phenomenon is caused by the ON resistance in an initial sensing operation for cell data. The current driving ability of the sense amplifier 15 constituted by the restore circuit 16 and the sense circuit 20 is improved by the potential difference caused by this special phenomenon so that the pair of bit lines BL and BBL having a large charge amount, i.e., a large wiring capacitance, can also be quickly driven.

At almost the same time, the potential of the signal SAP undergoes a transition from the VBL level to the VCC level. As a result, power supply potentials are respectively applied to the sources of the P-channel MOS transistors P1 and P2 constituting the restore circuit 16, and the restore circuit 16 is activated. When the restore circuit 16 is activated, differential amplification of the pair of bit lines BL and BBL is started. The restore circuit 16 supplies positive charge to the bit line BL whose potential is not the GND level via a current path of the transistor P1 so as to raise the potential of the bit line BL to the VCC level.

When the pair of bit lines BL and BBL undergo differential amplification, the data read out from the memory cell 24 is amplified to the potential VCC or the GND level. At the same time, refreshed data is rewritten in the memory cell 24 because the word line WL is kept at high level.

Subsequently, the potential of the designated column selection line CSL undergoes a transition from the GND level to the VCC level in accordance with an external column address signal. The pair of amplification lines BLC and BBLC belonging to the designated column are connected to the pair of DQ lines 12 via the column gate 22. The amplified cell data is then transferred to the pair of DQ lines 12 and is sent to a DQ buffer (not shown) from the pair of DQ lines 12. The data amplified again by the DQ buffer is sent to an I/O buffer, in which the data is amplified finally. The resultant data is output outside the memory device. Note that after the cell data is sent to the DQ buffer, the column selection line returns to the GND level to electrically disconnect the pair of amplification lines BLC and BBLC from the pair of DQ lines 12.

As described above, in the dynamic RAM having the φt gate 18, even bit lines having large wiring capacitances can be driven at a high speed by the special initial sensing operation, and the time required for a transition from a precharge period to an active period can be shortened. Therefore, a data access can be made at a high speed.

In recent dynamic RAMs, with an increase in data access speed, and a reduction in cycle time, a shorter time for a transition from an active period to a precharge period, i.e., a shorter equalization time, is required.

On the other hand, for example, the external power supply voltage VCC is lowered from 5 V to 3.3 V, posing difficulties in a technique of shortening the equalization time of a dynamic RAM. If, for example, the dynamic RAM has an external power supply voltage VCC of 3.3 V, the voltage at the source-drain path of the transistor constituting the bit line pair equalizer 14 is set at 3.3 V. For this reason, the driving ability of the transistor deteriorates. When the driving ability of the transistor deteriorates, the time required for equalization of a pair of bit lines is prolonged. As a result, the equalization time is prolonged to pose a problem in shortening the cycle time. This is the current technical situation.

If a pair of bit lines do not undergo complete equalization, the operation of the dynamic RAM is adversely affected.

For example, data read out from the memory cell 24 to the bit line, i.e., the potential difference between the pair of bit lines BL and BBL, is determined by the capacitor capacitance of the memory cell 24 and the wiring capacitance of the pair of bit lines. In general, this data is a small signal of about 100 mV. If, for example, equalization between a pair of bit lines is insufficient, and a potential difference is left therebetween, the potential of the bit line may not be set to the potential corresponding to the cell data by using such a small signal. In this case, the level of the data is inverted unintentionally, and the data is read out. In addition, this readout wrong data may be rewritten in the memory cell to destroy the correct cell data.

It is also found that the φt gate 18, by which a good effect can be obtained in differentially amplifying the potential difference between a pair of bit lines, delays equalization of an amplification line in a transition from an active period to a precharge period.

This phenomenon that amplification line equalization is delayed by the φt gate 18 will be described below.

FIG. 4 is a circuit diagram showing a dynamic RAM having the φt gate 18.

The dynamic RAM shown in FIG. 4 is a comparative example for explaining the effects of the present invention. This dynamic RAM is equivalent to the dynamic RAM of the first embodiment from which the amplification line pair equalizer 26 is omitted.

FIG. 5 is a timing chart showing a transition from an active period to a precharge period in the dynamic RAM shown in FIG. 4.

As shown in FIG. 5, when the dynamic RAM undergoes a transition from an active period to a precharge period, the potential of the word line WL, which has been at the VCC level, is set to the GND level. Subsequently, the potential of the precharge signal EQL for activating the bit line pair equalizer 14 changes from the GND level to the VCC level. At the same time, the potential of the signal SAP changes from the VCC level to the VBL level, and the potential of the signal BSAN changes to the VBL level. When both the signals SAP and BSAN are set at the VBL level, the restore circuit 16 and the sense circuit 20 are set in an inactive state. When the signal EQL is set at the VCC level, the equalizer 14 is activated to short-circuit the pair of bit lines BL and BBLC. With this operation, the potentials of the bit line BL and the inverted signal bit line BBL converge to the VBL level.

Meanwhile, equalization between the potentials of the amplification line BLC and the inverted signal amplification line BBLC is started after the potentials of the bit line BL and the inverted signal bit line BBL are supplied via the φt gate 18, and the potentials of the pair of amplification lines BLC and BBLC then converge to the VBL level.

A typical flow of equalization for a pair of bit lines has been described above.

In this case, some consideration must be given to a so-called "threshold drop" in an N-channel MOS transistor.

Owing to this "threshold drop", as shown in FIG. 5, the potential of the amplification line BLC is not at the VCC level during an active period. The potential of the amplification line BLC is lower than the potential VCC during the active period by a threshold voltage (the threshold voltage of the transistor N3) Vth of the φt gate. That is, the potential of the amplification line BLC is "VCC−Vth". Equalization of the amplification line BLC is started from the potential having undergone this threshold drop.

The φt gate 18 of the dynamic RAM shown in FIG. 3 or 4 is arranged to perform a data sensing operation at a high speed. For this reason, the N-channel MOS transistors N3 and N4 are designed to have high ON resistances.

Since the transistors N3 and N4 are used as a bidirectional switch (path transistor), the source potential and the back gate potential are different from each other. That is, a back gate bias effect tends to be produced. In addition, this switch is arranged in a portion adjacent to a memory cell array, i.e., a portion where transistors are densely arranged, in terms of a pattern. Therefore, the gate width cannot be increased. This small gate width also enhances the back gate bias effect. That is, the transistors N3 and N4 have high threshold voltages owing to the above structure.

In a typical operation of the dynamic RAM, an equalization time is started when the potential of the signal EQL is set at the VCC level. Especially, it takes time for the amplification line BLC until its potential starts dropping. That is, when the potential of the signal EQL is set at the VCC level, i.e., the potential of the bit line BL is kept at the VCC level, even if the gate potential of the transistor N3 is at the VCC level, the transistor N3 is in an OFF state. The conditions for turning on the transistor N3 are that the potential of the bit line BL lowers below the potential of the amplification line BLC, and the potential difference between the potential of the bit line BL and the gate potential exceeds the threshold voltage Vth.

As described above, since the threshold voltage Vth is high, the transistor N3 does not satisfy the above conditions unless the potential of the bit line BL considerably approaches the precharge potential VBL. Such a delay of the ON timing of the transistor N3 is the first cause that delays equalization of a pair of amplification lines.

Consider the second cause next.

The amplification line BLC is kept in an electrically floating state until the transistor N3 is turned on. When the amplification line BLC is in an electrically floating state, the potential of the amplification line BLC temporarily rises, as shown in FIG. 5. The cause of this phenomenon is that the transistor N2, which constitutes the sense circuit 20, potentially has an overlap capacitance Col between its gate and source, as shown in FIG. 6. In an equalization period, the source potential of the transistor N2 undergoes a transition from the GND level to the VBL level. At this time, the source of the transistor N2 and the amplification line BLC connected to the gate of the transistor N2 cause capacitive coupling owing to the above capacitance Col. The potential of the amplification line BLC in an electrically floating state is raised by this capacitive coupling.

The operation of the dynamic RAM shown in FIG. 3 will be described next.

Figure 7:
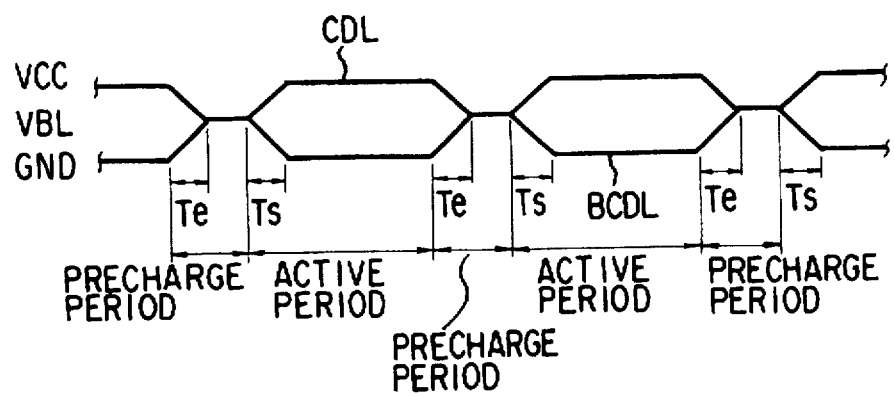
FIG. 7 is a timing chart showing the operation cycle of the dynamic RAM.

FIG. 7 is a timing chart for explaining the operation cycle of the dynamic RAM according to the first embodiment of the present invention.

As shown in FIG. 7, as in a typical dynamic RAM, the operation cycle of the dynamic RAM shown in FIG. 3 is roughly divided into an active period in which a potential difference is caused between column data lines CDL and BCDL, and a precharge period in which the potentials of the column data lines CDL and BCDL are precharged to the precharge potential VBL.

An operation in a transition from a precharge period to an active period will be described first.

In the dynamic RAM shown in FIG. 3, the φt gate 18 is arranged between the restore circuit 16 and the sense circuit 20. During the active period, the signal EQL is at the GND level, and the amplification line pair equalizer 26 is in an OFF state. For this reason, a potential difference is caused earlier between the pair of amplification lines BLC and BBLC than between the pair of bit lines BL and BBL. With such an initial sensing operation, the current driving ability of the sense amplifier constituted by the restore circuit 16 and the sense circuit 20 is improved. As a result, a time Ts (see FIG. 7) required for a transition from a precharge period to an active period can be shortened. This shortening effect mainly contributes to an increase in data access speed.

In order to schematically discriminate an active period from a precharge period, FIG. 7 exemplifies the potentials of the column data lines CDL and BCDL.

An operation (equalizing operation) in a transition from an active period to a precharge period will be described next.

Figure 8:
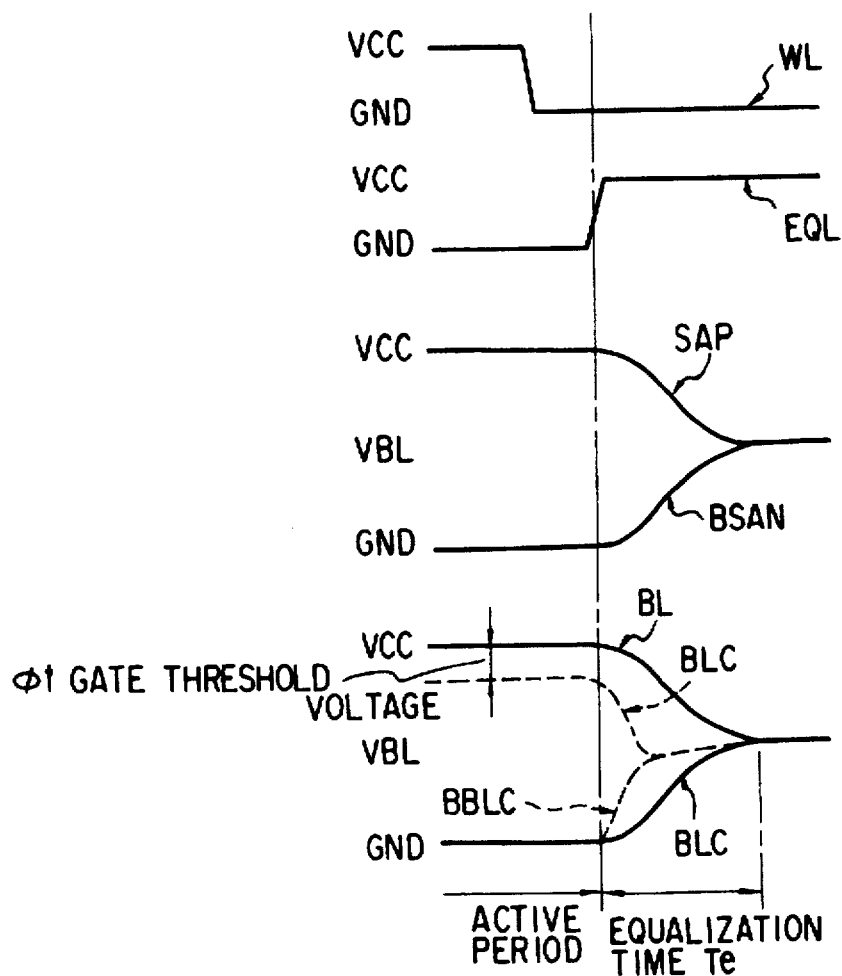
FIG. 8 is a timing chart showing the operation of the dynamic RAM in FIG. 3.

FIG. 8 is a timing chart showing the operation of the dynamic RAM according to the first embodiment of the present invention in a case wherein the dynamic RAM undergoes a transition from an active period to a precharge period.

As shown in FIG. 8, when the dynamic RAM undergoes a transition from an active period to a precharge period, the potential of the word line WL, which has been at the VCC level, is set to the GND level. Subsequently, the potential of the signal EQL for activating the bit line pair equalizer 14 and the amplification line pair equalizer 26 changes from the GND level to the VCC level. At the same, the potential of the signal SAP changes from the VCC level to the VBL level. In addition, the signal BSAN changes from the GND level to the VBL level. When both the signals SAP and BSNA are set at the VBL level, the restore circuit 16 and the sense circuit 20 are set in an inactive state. In addition, when the signal EQL is set at the VCC level, the equalizers 14 and 26 are activated to short-circuit the pair of bit lines BL and BBL. The potentials of the two bit lines BL and BBL converge to the VBL level. At the same time, the potentials of the amplification lines BLC and BBLC converge to half of the amplification line pair potential difference, e.g., (VCC–Vth)/2, without causing any potential rise in the high-potential-side amplification line.

Figure 9:
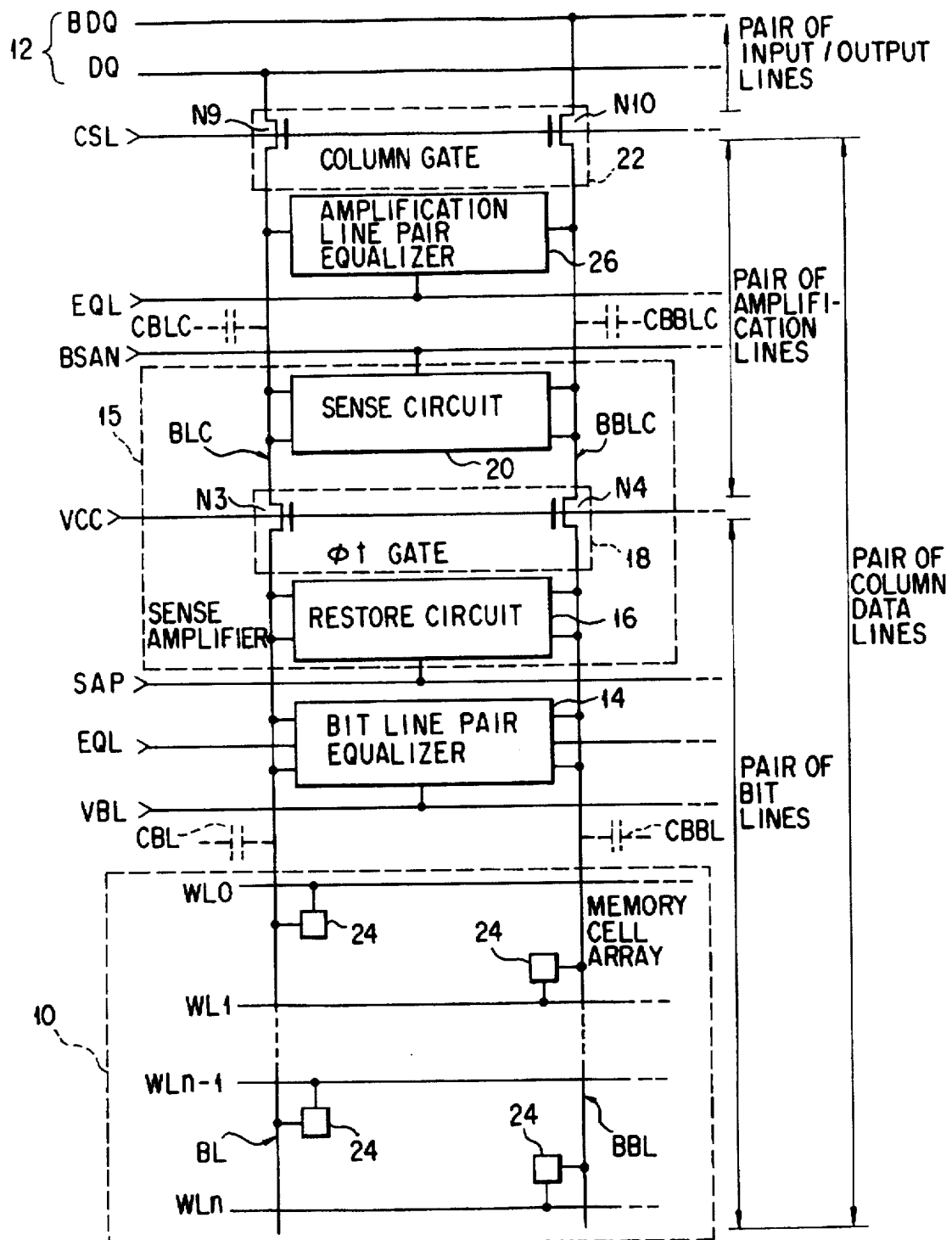
FIG. 9 is a block diagram showing the wiring capacitance of the dynamic RAM in FIG. 3.

FIG. 9 is a block diagram showing the capacitance a pair of column data lines of the dynamic RAM according to the first embodiment of the present invention.

As shown in FIG. 9, in the dynamic RAM according to the first embodiment of the present invention, the pair of bit lines BL and BBL and the pair of amplification lines BLC and BBLC are capacitively divided by the $\phi$t gate 18.

FIG. 9 shows a wiring capacitance $C_{BL}$ of the bit line BL, a wiring capacitance $C_{BBL}$ of the bit line BBL, a wiring capacitance $C_{BLC}$ of the amplification line BLC, and a wiring capacitance $C_{BBLC}$ of the amplification line BBLC. Both the capacitance $C_{BLC}$ and the capacitance $C_{BBLC}$ are smaller than capacitance $C_{BL}$ and the capacitance $C_{BBL}$. For this reason, if the equalizers simultaneously start to operate, equalization of the pair of amplification lines BLC and BBLC having small wiring capacitances is completed earlier than that of the pair of bit lines BL and BBL (see FIG. 8). The potentials of the amplification lines BLC and BBLC are (VCC–Vth)/2 upon completion of equalization. However, after the potentials of the amplification lines BLC and BBLC reach the above potential, these potentials are drawn to the potential VBL of the bit lines BL and BBL and start to rise. For this reason, when the potentials of the bit lines BL and BBL reach the VBL level, both the potentials of the amplification lines BLC and BBLC also rise to the VBL level. In this manner, both the pair of bit lines BL and BBL and the pair of amplification lines BLC and BBLC are set at the same potential, so that the potentials of the pair of column data lines are set to the precharge potential VBL.

Figure 10A:
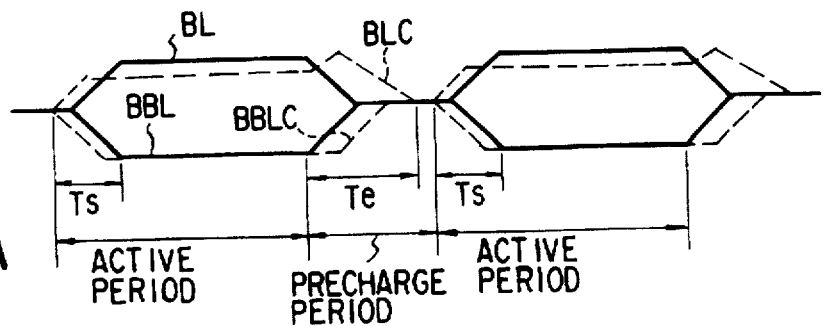
FIG. 10A is a timing chart showing the operation of the dynamic RAM in FIG. 4.
Figure 10B:
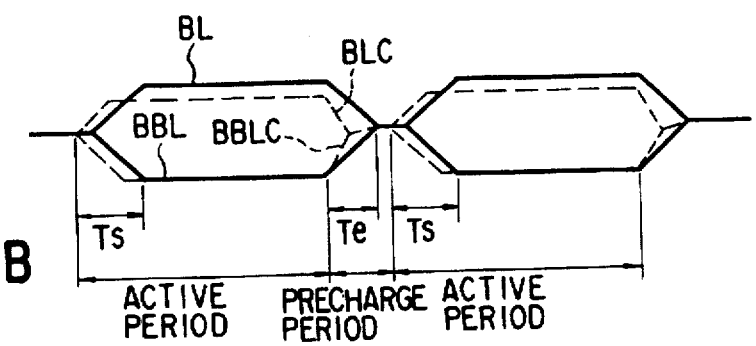
FIG. 10B is a timing chart showing the operation of the dynamic RAM in FIG. 3.

FIG. 10A shows the operation of the dynamic RAM as the comparative example shown in FIG. 4. FIG. 10B shows the operation of the dynamic RAM according to the first embodiment of the present invention.

As shown in FIG. 10B, the time (equalization time) Te for a transition from an active period to a precharge period is shortened in the dynamic RAM shown in FIG. 3 as compared with the dynamic RAM shown in FIG. 4. Therefore, a high-speed operation can be performed.

The above increase in equalizing operation speed is not influenced by the threshold voltages of the transistors N3 and N4 constituting the $\phi$t gate 18 because the pair of amplification lines BCL and BBCL are equalized independently. That is, even if the transistors N3 and N4 have high threshold voltages, the time between the beginning of an equalizing operation and the end of the operation does not change. Therefore, a new element pattern increase due to addition of the equalizer 26 can be minimized by reducing the gate widths of the transistors N3 and N4 and reducing the element pattern of the $\phi$t gate 18.

In addition, since the wiring capacitances of the pair of amplification lines BLC and BBLC are small, the transistor N8 is not required to have a very high current driving ability. For this reason, the gate width of the transistor N8 can be reduced, and hence the element pattern of the equalizer 26 can be reduced. For example, the gate width of the transistor N8 included in the equalizer 26 may be set to be smaller than that of the transistor N5 included in the equalizer 14.

As described above, a new element pattern increase can also be minimized by setting the gate width of the transistor N8 to be large enough to obtain a current driving ability suitable for the wiring capacitances of the pair of amplification lines BLC and BBLC instead of unnecessarily increasing the gate width.

A dynamic RAM according to the second embodiment of the present invention will be described below.

Figure 11:
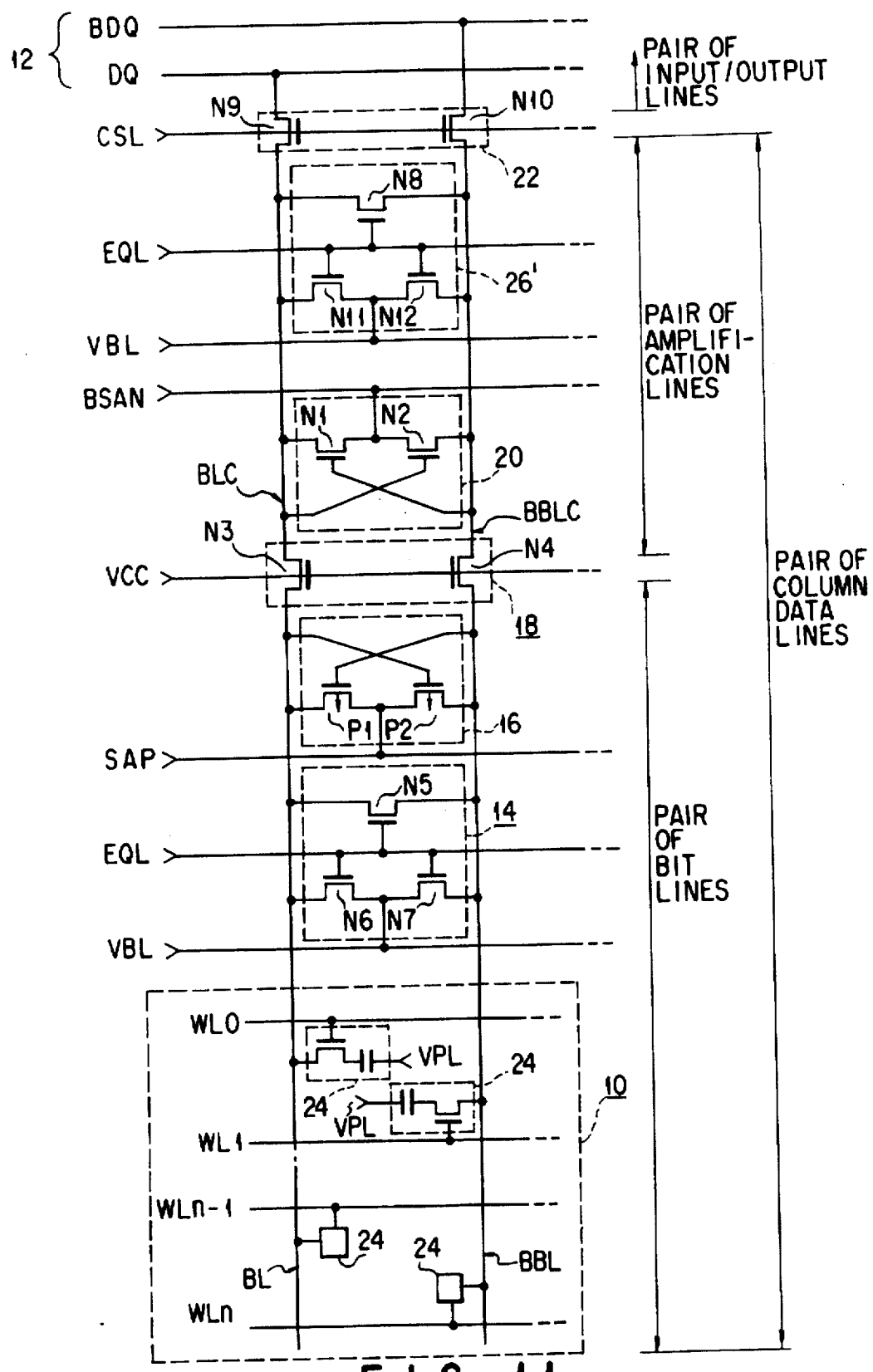
FIG. 11 is a circuit diagram showing a dynamic RAM according to the second embodiment of the present invention.

FIG. 11 is a circuit diagram showing the dynamic RAM according to the second embodiment of the present invention.

As shown in FIG. 11, the dynamic RAM according to the second embodiment, similar to the bit line pair equalizer 14, an amplification line pair equalizer 26' is designed such that a precharge potential VBL can be applied to a pair of amplification lines after the equalizer is turned on by a precharge signal EQL.

The amplification line pair equalizer 26' includes three N-channel transistors N8, N11, and N12. The transistor N8 has the same connected state as that of the transistor N8 shown in FIG. 3. The drain and source terminals of the transistor N11 are respectively connected to an amplification line BLC and a line to which the precharge potential VBL is applied. Similarly, the drain and source terminals of the transistor N12 are respectively connected to an amplification line BBLC and the line to which the precharge potential VBL is supplied.

The gate terminals of these three transistors N8, N11, and N12 are commonly coupled to each other, and the precharge signal EQL, which is at high level during a precharge period of the dynamic RAM, is supplied to this common node.

Figure 12:
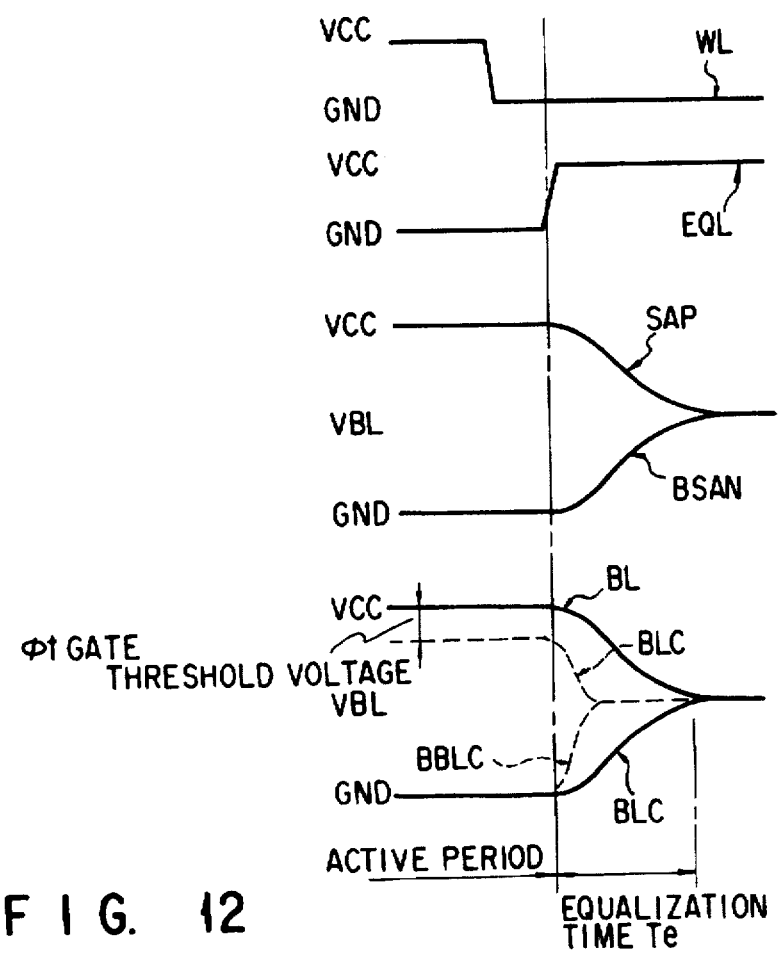
FIG. 12 is a timing chart showing the operation of the dynamic RAM in FIG. 11.

FIG. 12 is a timing chart showing the operation of the dynamic RAM in FIG. 11 in a case wherein a transition from an active period to a precharge period occurs.

As shown in FIG. 12, since both the amplification lines BLC and BBLC receive the potential VBL from the equalizer 26', the potentials of amplification lines BLC and BBLC are set at the VBL level upon completion of equalization of the pair of amplification lines.

In the dynamic RAM according to the second embodiment, the effect of shortening an equalization time Te can be obtained as in the dynamic RAM according to the first embodiment, and the following effect can also be obtained.

In the dynamic RAM according to the first embodiment, in order to set the pair of amplification lines BLC and BBLC at the precharge potential VBL, the potential VBL is applied from the bit line pair equalizer 14 to the pair of amplification lines via the φt gate 18. In contrast to this, in the dynamic RAM according to the second embodiment, since the amplification line pair equalizer 26' itself can apply the potential VBL to the pair of amplification lines BLC and BBLC, the potentials of the pair of amplification lines BLC and BBLC can be set to the precharge potential VBL without applying the potential VBL from the bit line pair equalizer 14. For this reason, the φt gate 18 can be controlled during a precharge period. For example, the φt gate 18 can be turned off by applying a potential of the GND level to the gate terminal of the φt gate 18 during a precharge period instead of always applying a potential VCC thereto. Therefore, the degree of freedom in circuit design increases.

Currently, dynamic RAMs are subdivided into various types of memories from the viewpoint of systems. An increase in the degree of freedom in circuit design, in such subdivided various dynamic RAMs, leads to the expansion of the range of dynamic RAMs to which the present invention can be applied.

Note that the transistors Nil and N12 included in the equalizer 26' are not required to have very high current driving abilities, unlike the case of the transistor N8. For this reason, an element pattern increase can be minimized by setting the gate widths of the transistors Nil and N12 to be large enough to obtain current driving abilities suitable for the wiring capacitance of the pair of amplification lines. For example, the gate widths of the transistors N11 and N12 included in the equalizer 26' may be set to be smaller than those of the transistors N6 and N7 included in the equalizer 14.

A dynamic RAM according to the third embodiment of the present invention will be described next.

FIG. 13 is a block diagram showing the dynamic RAM according to the third embodiment of the present invention.

As shown in FIG. 13, the dynamic RAM according to the third embodiment exemplifies the case wherein the present invention is applied to a dynamic RAM of a shared sense amplification scheme by using the amplification line pair equalizer 26' in the dynamic RAM according to the second embodiment.

In brief, the dynamic RAM of the shared sense amplification scheme is designed to reduce the number of circuits by allowing a plurality of memory cells to share one sense amplifier.

In the dynamic RAM of the shared sense amplification scheme, in order to allow common use of one sense amplifier, connection switches are respectively arranged between the first memory cell array and a common sense amplifier and between the second memory cell array and the common sense amplifier. These connection switches are controlled so as not to be simultaneously turned on in a data read/write operation. For example, the connection switches are controlled to alternately connect the first and second memory cell arrays to the common sense amplifier.

The dynamic RAM according to this embodiment has a φt gate 18. By using the φt gate 18, a memory cell array is ON/OFF-controlled by, for example, applying a potential of the GND level to the gate in electrically disconnecting the memory cell array from the sense amplifier. That is, by supplying a memory cell array selection signal to the φt gate 18, a connection switch required for the dynamic RAM of the shared sense amplification scheme can be obtained.

As shown in FIG. 13, in this embodiment, a common circuit 28 is obtained by commonly using a sense circuit 20, an amplification line pair equalizer 26', and a column gate 22 of the peripheral circuits belonging to first and second memory cell arrays 10A and 10B.

The common circuit 28 also includes a pair of amplification lines BLC and BBLC commonly used in the arrays 10A and 10B. One end of each of the common pair of amplification lines BLC and BBLC is connected to a corresponding one of a first pair of bit lines BLA and BBLA via a first φt gate 18A, whereas the other end of each of the pair of amplification lines is connected to a corresponding one of a second pair of bit lines BLB and BBLB via a second φt gate 18B. An array selection signal φtA is supplied to the first φt gate 18A. An array selection signal φtB is supplied to the second φt gate 18B. The φt gates 18A and 18B are controlled by the signals φtA and φtB so as not to be simultaneously turned on at least in a data read/write operation. A pair of DQ lines 12 are connected to the common pair of amplification lines BLC and BBLC via the column gate 22.

Note that the circuit arrangements of bit line pair equalizers 14A and 14B, restore circuits 16A and 16B, and the sense circuit 20 are the same as those in the dynamic RAM shown in FIG. 3.

As described above, the present invention can be applied to a dynamic RAM of the shared sense amplification scheme.

The dynamic RAM according to this embodiment has the equalizer 26' which can independently equalize and precharge the amplification lines BLC and BBLC shared by the arrays 10A and 10B. For this reason, the following effect can be obtained.

Assume that the equalizer 26' is omitted from the dynamic RAM according to the third embodiment. In this case, in order to equalize the common pair of amplification lines BLC and BBLC, either the φt gate 18A or the φt gate 18B must be turned on, and the common amplification lines BLC and BBLC must be short-circuited by using the bit line pair equalizer 14A or 14B. For this purpose, the φt gate 18A or 18B must be turned on during a precharge period. According to such a control scheme, ON/OFF switching must be performed between the φt gates 18A and 18B when a transition to an active period is performed. This switching operation is required, for example, in the following case. The φt gate 18A is turned on in a precharge period. In the subsequent active period, the array 10B is selected. For this reason, the φt gate 18A is turned off, and the φt gate 18B is turned on. Such ON/OFF switching between the o t gates 18A and 18B must be performed within a limited period of time for a transition from a precharge period to an active period. Therefore, the time allowed for this operation is limited. This makes it difficult to perform switching control.

In contrast to this, in the dynamic RAM according to the third embodiment, the common pair of amplification lines BLC and BBLC can be equalized while both the φt gates 18A and 18B are in an OFF state. For this reason, the above switching control need not be performed, and it is only required to turn on the φt gate 18 on the array side to be selected. Therefore, the φt gates 18 can be controlled more easily than in the above control scheme. This allows a sufficient time for control.

In addition, by turning off both the φt gates 18A and 18B during a precharge period, the common pair of amplification lines BLC and BBLC, the first pair of bit lines BLA and BBLA, and the second pair of bit lines BLB and BBLB can be electrically disconnected from each other. Even if, therefore, data is transferred to the first pair of bit lines BLA and BBLA or the second pair of bit lines BLB and BBLB before selection of an array, the data is not transferred to the common pair of amplification lines BLC and BBLC. This increases the circuit operation margin.

Furthermore, with the use of this advantage, for example, circuit design may be performed such that data is read out to the first pair of bit lines BLA and BBLA and the second pair of bit lines BLB and BBLB in advance before selection of an array in order to increase the data read rate.

A dynamic RAM according to the fourth embodiment of the present invention will be described next.

Figure 14:
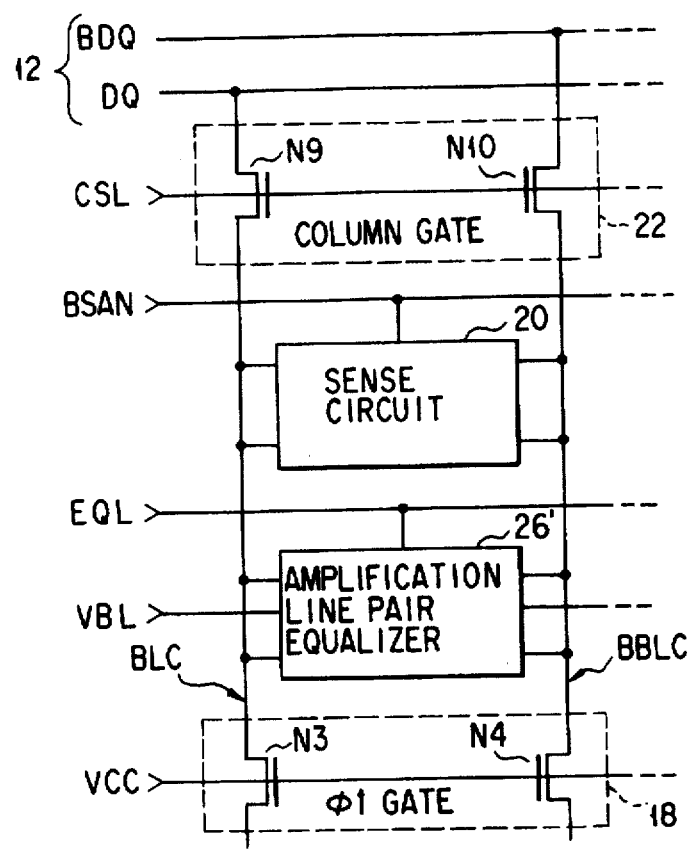
FIG. 14 is a block diagram showing a dynamic RAM according to the fourth embodiment of the present invention.

FIG. 14 is a block diagram showing the dynamic RAM according to the fourth embodiment of the present invention.

Referring to FIG. 14, an amplification line pair equalizer 26' may be arranged between a sense circuit 20 and a $\phi$t gate 18. In the dynamic RAM shown in FIG. 14, the amplification line pair equalizer 26' may be replaced with an equalizer 26 like the one shown in FIG. 3 which is designed to only short-circuit a pair of amplification lines BLC and BBLC.

In the dynamic RAMs according to the first to fourth embodiments, the time (equalization time) Te for a transition from an active period to a precharge period can be shortened by using the equalizer for equalizing the pair of amplification lines BLC and BBLC. Therefore, an increase in operation speed can be attained. In addition, this can contribute to a promising technique of shortening the cycle time.

In the dynamic RAM according to the first embodiment, since only one transistor is required to be added, an increase in the number of elements can be minimized. In addition, an element pattern increase can be minimized by reducing the gate widths of the transistors N3, N4, and N8 and reducing the element patterns of the $\phi$t gate 18 and the equalizer 26.

In the dynamic RAMs according to the second and third embodiments, since the amplification line pair equalizer can apply the precharge potential VBL, the final equalization levels of the pair of amplification lines BLC and BBLC need not be relied on the bit line pair equalizer. As a result, for example, the technique of keeping the m gate off during a precharge period can be used, increasing the degree of freedom in circuit design. Especially, by keeping the $\phi$t gate off during a precharge period to keep electrically disconnecting the pair of bit lines BL and BBL and the pair of amplification lines BLC and BBLC, excellent effects, e.g., an increase in circuit operation margin, can be obtained.

In the dynamic RAMs according to the first to fourth embodiments, with the use of the amplification line pair equalizer 26, the pair of amplification lines BLC and BBLC reach the equalize level earlier than the pair of bit lines BL and BBL. With this characteristic operation, the following effect can also be obtained.

Figure 15:
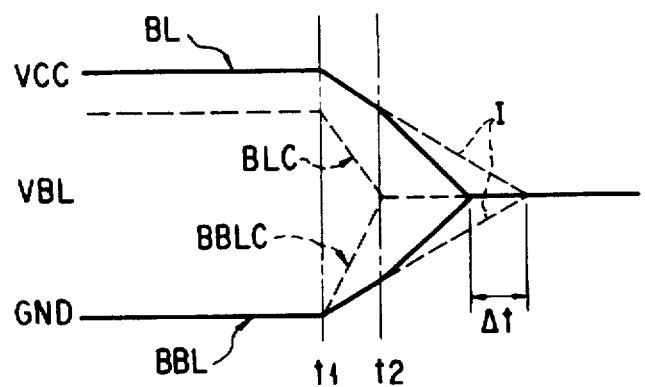
FIG. 15 is a timing chart showing changes in the potentials of a pair of column data lines of a dynamic RAM according to the present invention.

FIG. 15 is a timing chart showing changes in the potentials of a pair of column data lines in a dynamic RAM according to the present invention in a transition from an active period to a precharge period.

As shown in FIG. 15, in the dynamic RAM according to the present invention, a pair of amplification lines BLC and BBLC reach a precharge potential VBL earlier than a pair of bit lines BL and BBL. With this operation, the potentials of the pair of bit lines converge to the precharge potential VBL at a higher speed.

Time t1 shown in FIG. 15 is the time at which an equalizing operation is started. At this time, the potentials of the pair of bit lines BL and BBL and the pair of amplification lines BLC and BBLC begin to converge to the precharge potential VBL at once. At time t2, the pair of amplification lines BLC and BBLC reach the potential VBL. At about time t2, the speed at which the pair of bit lines BL and BBL converge to the potential VBL increases noticeably. The following causes of this phenomenon are conceivable: the potentials of the pair of bit lines BL and BBL being capacitively coupled to the potentials of the pair of amplification lines BLC and BBLC to be drawn to the potential VBL; and the potential VBL being applied to the pair of bit lines BL and BBL when the $\phi$t gate is kept on.

Referring to FIG. 15, broken lines I indicate changes in the potentials of the pair of bit lines BL and BBL, which are estimated in consideration of the above function. As is apparent from the comparison between the lines I and the lines indicating the actual changes in potential, the actual potentials reach the potential VBL earlier than the estimated potentials by $\Delta$t.

Therefore, the equalization time can also be shortened by causing the potentials of the pair of amplification lines BLC and BBLC to reach the potential VBL earlier than those of the pair of bit lines BL and BBL.

In addition, the present invention can be modified as follows.

As the high-resistance portion R1 shown in FIG. 2, a transistor N3 shown in FIG. 16A may be used. In addition, another high-resistance element may be used. For example, a resistive member such as an impurity diffusion layer resistor 102 formed in a silicon substrate 100 as shown in FIG. 16B or a polysilicon film 104 formed in a silicon substrate 100 as shown in FIG. 16C may be used. With such a resistive element as well, a pair of column data lines can be capacitively divided into a pair of bit lines on the memory cell side and a pair of cell data amplification lines on the column gate side.

FIGS. 16A to 16C show only the modifications of the high-resistance portion R1. However, one of the resistors shown in FIGS. 16A to 16C may be used as the high-resistance portion R2.

One example of the precharge potential VBL used in the embodiment is VCC/2 (i.e., half the power-supply voltage VCC). Another example is a slightly higher one, e.g., about 60% of the voltage VCC. If the precharge potential VBL is set at a value somewhat higher than VCC/2, the equalizing time Te will be lengthened, though the sense time Ts will be shortened.

Nonetheless, in the present invention, both the sense time Ts and the equalizing time Te can be shortened even if the precharge potential VBL is a little higher than VCC/2.

As has been described above, according to the present invention, there is provided a semiconductor memory device which can shorten both the time required to amplify the potential difference between a pair of column data lines and the time required to equalize the potential difference therebetween.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a first input/output data line;
   a second input/output data line paired with said first data line;
   a first resistive element;
   a second resistive element;
   a first amplification line connected to a first end of said first resistive element;
   a second amplification line connected to a first end of said second resistive element and paired with said first amplification line;
   a first connection circuit for electrically connecting said first input/output data line to said first amplification line in accordance with a column selection signal;
   a second connection circuit for electrically connecting said second input/output data line to said second amplification line in accordance with said column selection signal;
   a first equalization circuit for equalizing potentials of said first and second amplification lines in accordance with an equalization signal;
   a first amplification circuit for amplifying a difference between the potentials of said first and second amplification lines in accordance with a first activation signal said first amplification circuit having a power supply end which is capacitively coupled to each of said first and second amplification lines and which is supplied with a voltage varying in level in accordance with an active or an inactive state of said first amplification circuit;
   a first dynamic memory cell connected to a first word line;
   a second dynamic memory cell connected to a second word line;
   a first bit line for connecting said first memory cell to a second end of said first resistive element;
   a second bit line, paired with said first bit line, for connecting said second memory cell to a second end of said second resistive element;
   a second equalization circuit for equalizing potentials of said first and second bit lines in accordance with said equalization signal; and
   a second amplification circuit for amplifying a difference between the potentials of said first and second bit lines in accordance with a second activation signal, said second amplification circuit having a power supply end which is capacitively coupled to each of said first and second bit lines and which is supplied with a voltage varying in level in accordance with an active or an inactive state of said second amplification circuit.

2. A device according to claim 1, wherein said first activation signal is a signal for supplying power to said first amplification circuit,
   said second activation signal is a signal for supplying power to said second amplification circuit, and
   said first and second equalization circuits are kept off at least during a period in which power is supplied to said first and second amplification circuits.

3. A device according to claim 2, wherein potentials of said first and second activation signals change to an equalization level after said first and second equalization circuits receive said equalization signal.

4. A device according to claim 3, wherein at least the potentials of said first and second amplification lines are equalized earlier than those of said first and second bit lines after said first and second equalization circuits are turned on upon reception of said equalization signal.

5. A device according to claim 4, wherein said first and second connection circuits are column gates,
   said first equalization circuit is an amplification line pair equalizer,
   said first amplification circuit is a sense circuit,
   said second equalization circuit is a bit line pair equalizer, and
   said second amplification circuit is a restore circuit.

6. A device according to claim 5, wherein said column gate includes
   a first N-channel insulated gate field effect transistor having a current path connected in series between said first input/output data line and said first amplification line, and a gate for receiving said column selection signal, and
   a second N-channel insulated gate field effect transistor having a current path connected in series between said second input/output data line and said second amplification line, and a gate for receiving said column selection signal,
   said amplification line pair equalizer includes
   a third N-channel insulated gate field effect transistor having a current path connected in series between said first and second amplification lines, and a gate for receiving said equalization signal,
   said sense circuit includes
   a fourth N-channel insulated gate field effect transistor having one end of a current path which is connected to said first amplification line, a gate connected to said second amplification line, and the other end of the current path through which said first activation signal is received, and
   a fifth N-channel insulated gate field effect transistor having one end of a current path which is connected to said second amplification line, a gate connected to said first amplification line, and the other end of the current path through which said first activation signal is received,
   said bit line pair equalizer includes
   a sixth N-channel insulated gate field effect transistor having a current path connected in series between said first and second bit lines, and a gate for receiving said equalization signal, and
   said restore circuit includes
   a first P-channel insulated gate field effect transistor having one end of a current path which is connected to said first bit line, a gate connected to said second bit line, and the other end of the current path through which said second activation signal is received, and
   a second P-channel insulated gate field effect transistor having one end of a current path which is connected to said second bit line, a gate connected to said first bit line, and the other end of the current path through which said second activation signal is received.

7. A device according to claim 6, wherein said amplification line pair equalizer circuit further includes
   a seventh N-channel insulated gate field effect transistor having one end of a current path which is connected to said first amplification line, the other end of the current path through which a precharge potential is received, and a gate for receiving said equalization signal, and an eighth N-channel insulated gate field effect transistor having one end of a current path which is connected to said second amplification line, the other end of the current path through which said precharge potential is received, and a gate for receiving said equalization signal, and said bit line pair equalizer circuit further includes
a ninth N-channel insulated gate field effect transistor having one end of a current path which is connected to said first bit line, the other end of the current path through which said precharge potential is received, and a gate for receiving said equalization signal, and a tenth N-channel insulated gate field effect transistor having one end of a current path which is connected to said second bit line, the other end of the current path through which said precharge potential is received, and a gate for receiving said equalization signal.

8. A device according to claim 1, wherein said first resistive element includes a resistive body, said resistive body being selected from the group including a source-drain resistor of an insulated gate field effect transistor, a diffusion layer resistor formed in a semiconductor substrate, and a resistive material formed on a semiconductor substrate, and said second resistive element includes a resistive body, said resistive body being selected from the group including a source-drain resistor of an insulated gate field effect transistor, a diffusion layer resistor formed in a semiconductor substrate, and a resistive member formed on a semiconductor substrate.

9. A device according to claim 1, wherein said first resistive element is an insulated gate field effect transistor, said insulated gate field effect transistor being turned on when data is read out from said first memory cell to said first input/output data line, and data is written from said first input/output data line into said first memory cell, and said second resistive element is an insulated gate field effect transistor, said insulated gate field effect transistor being turned on when data is read out from said second memory cell to said second input/output data line, and data is written from said second input/output data line into said second memory cell.

10. A device according to claim 1, wherein said first equalization circuit short-circuits said first and second amplification lines at least once during a period in which said first and second amplification lines are precharged.

11. A device according to claim 10, wherein said first equalization circuit includes at least one insulated gate FET, said at least one insulated gate FET having one end of a current path which is connected to said first amplification line, and the other end of the current path which is connected to said second amplification line, and a gate to which a signal for turning on said insulated gate FET is supplied at least once during a precharge period.

12. A semiconductor memory device comprising:
a first memory cell array;
a second memory cell array;
a first bit line pair, each bit line of said first bit line pair having a first end connected to a memory cell of said first memory cell array;
a second bit line pair, each bit line of said second bit line pair having a first end connected to a memory cell of said second memory cell array;
a first connection switch connected to a second end of each bit line of said first bit line pair, said first connection switch being switched on when said first memory cell array is accessed;
a second connection switch connected to a second end of each bit line of said second bit line pair, said second connection switch being switched off when said first memory cell array is accessed;
a pair of amplification lines for connecting said first connection switch to said second connection switch;
a pair of input/output data lines;
a column selection switch for electrically connecting said pair of amplification lines to said pair of input/output data lines in accordance with a column selection signal;
a first equalization circuit for equalizing potentials of said pair of amplification lines,
a second equalization circuit for equalizing potentials of said first bit line pair; and a third equalization circuit for equalizing potentials of said second bit line pair.

13. A device according to claim 12, wherein said first and second connection switches are kept off at least during a period in which said pair of amplification lines are equalized.

14. A semiconductor memory device comprising:
a memory cell array;
a column gate which is enabled/disabled in accordance with a column selection signal;
a pair of bit lines including first and second bit lines, each of said first and second bit lines having a first end connected to said memory cell array;
a pair of amplification lines including first and second amplification lines, each of said first and second amplification lines having a first end connected to said column gate;
a pair of resistive elements including first and second resistive elements, each of said first and second resistive elements having a first end connected to a second end of a corresponding one of said first and second bit lines, and a second end connected to a second end of a corresponding one of said first and second amplification lines;
a first amplification circuit for amplifying a potential difference between said pair of amplification lines, said first amplification circuit including first and second insulated gate field effect transistors which are connected in series between said first and second amplification lines, said first insulated gate field effect transistor having a gate connected to said first amplification line, said second insulated gate field effect transistor having a gate connected to said second amplification line, said first and second insulated gate field effect transistors being connected to a common connection node serving as a power supply end which is supplied with a voltage varying in level in accordance with an active or inactive state of said first amplification circuit;
a first equalization circuit for equalizing potentials of said first and second amplification lines;
a second amplification circuit for amplifying a potential difference between said first and second bit lines, said second amplification circuit including third and fourth insulated gate field effect transistors which are connected in series between said first and second bit lines, said third insulated gate field effect transistor having a gate connected to said first bit line, said fourth insulated gate field effect transistor having a gate connected to said second bit line, said third and fourth insulated gate field effect transistors being connected to a common connection node serving as a power supply end which is applied with a voltage varying in level in accordance with an active or inactive state of said second amplification circuit; and a second equalization circuit for equalizing potentials of said first and second bit lines.

15. A semiconductor memory device comprising:

a pair of column data lines including a first column data line having a resistive element portion and a second column data line having a resistive element portion;

a memory cell array connected to a first end of each of said first and second column data lines;

a column gate connected to a second end of each of said first and second column data lines, said column gate being enabled/disabled in accordance with a column selection signal;

a first equalization circuit for equalizing a potential of a first portion of said first column data line between said memory cell array and said resistive element portion and a potential of a first portion of said second column data line between said memory cell array and said resistive element portion;

a first amplification circuit for amplifying a potential difference between the first portion of said first column data line and the first portion of said second column data line, said first amplification circuit including a first and second insulated gate field effect transistors which are connected in series between the first portion of said first column data line and the first portion of said second column data line, said first insulated gate field effect transistor having a gate connected to the first portion of said first column data line, said second insulated gate field effect transistor having a gate connected to the first portion of said second column data line, said first and second insulated gate field effect transistors being connected to a common connection node serving as a power supply end which is supplied with a voltage varying in level in accordance with an active or inactive state of said first amplification circuit;

a second equalization circuit for equalizing a potential of a second portion of said first column data line between said column gate and said resistive element portion and a potential of a second portion of said second column data line between said column gate and said resistive element portion; and a second amplification circuit for amplifying a potential difference between the second portion of said first column data line and the second portion of said second column data line, said second amplification circuit including third and fourth insulated gate field effect transistors which are connected in series between the second portion of said first column data line and the second portion of said second column data line, said third insulated gate field effect transistor having a gate connected to the second portion of said first column data line, said fourth insulated gate field effect transistor having a gate connected to the second portion of said second column data line, said third and fourth insulated gate field effect transistors being connected to a common connection node serving as a power supply end which is supplied with a voltage varying in level in accordance with an active or inactive state of said second amplification circuit.

16. A semiconductor memory device comprising:

a first input/output data line;

a second input/output data line paired with said first input/output data line;

a first resistive element;

a second resistive element;

a third resistive element;

a fourth resistive element;

a first memory cell array including a first dynamic memory cell connected to a first word line, and a second dynamic memory cell connected to a second word line;

a second memory cell array including a third dynamic memory cell connected to a third word line, and a fourth dynamic memory cell connected to a fourth word line;

a first bit line for connecting a first end of a current path of said first resistive element to said first memory cell;

a second bit line, paired with said first bit line, for connecting a first end of a current path of said second resistive element to said second memory cell;

a third bit line for connecting a first end of a current path of said third resistive element to said third memory cell;

a fourth bit line, paired with said third bit line, for connecting a first end of a current path of said fourth resistive element to said fourth memory cell;

a first amplification line for connecting a second end of the current path of said first resistive element to a second end of the current path of said third resistive element;

a second amplification line, paired with said first amplification line, for connecting a second end of the current path of said second resistive element to a second end of the current path of said fourth resistive element;

a first connection circuit for electrically connecting said first input/output data line to said first amplification line in accordance with a column selection signal;

a second connection circuit for electrically connecting said second input/output data line to said second amplification line in accordance with said column selection signal;

a first equalization circuit for equalizing potentials of said first and second bit lines in accordance with an equalization signal;

a first amplification circuit for amplifying a potential difference between said first and second bit lines in accordance with a first activation signal, said first amplification circuit having a power supply end which is capacitively coupled to each of said first and second bit lines and which is supplied with a voltage varying in level in accordance with an active or inactive state of said first amplification circuit;

a second equalization circuit for equalizing potentials of said third and fourth bit lines in accordance with said equalization signal;

a second amplification circuit for amplifying a potential difference between said third and fourth bit lines in accordance with said first activation signal, said second amplification circuit having a power supply end which is capacitively coupled to each of said third and fourth bit lines and which is supplied with a voltage varying in level in accordance with an active or inactive state of said second amplification circuit;

a third equalization circuit for equalizing potentials of said first and second amplification lines in accordance with said equalization signal; and a third amplification circuit for amplifying a potential difference between said first and second amplification lines in accordance with a second activation signal, said third amplification circuit including a power supply end which is capacitively coupled to each of said first and second amplification lines and which is supplied with a voltage varying in level in accordance with an active or inactive state of said third amplification circuit.

17. A semiconductor memory device comprising:

a first memory cell array;

a second memory cell array;

a first bit line pair including first and second bit lines, each of said first and second bit lines having a first end connected to said first memory cell array;

a second bit line pair including third and fourth bit lines, each of said third and fourth bit lines having a first end connected to said second memory cell array;

a first pair of resistive elements including first and second resistive elements, each of said first and second resistive elements having a first end connected to a second end of a corresponding one of said first and second bit lines;

a second pair of resistive elements including third and fourth resistive elements, each of said third and fourth resistive elements having a first end connected to a second end of a corresponding one of said third and fourth bit lines;

a pair of amplification lines including first and second amplification lines, each of said first and second amplification lines having a first end connected to a second end of a corresponding one of said first and second resistive elements, and a second end connected to a second end of a corresponding one of said third and fourth resistive elements;

a column gate connected to said first and second amplification lines, said column gate being enabled/disabled in accordance with a column selection signal;

a first amplification circuit for amplifying a potential difference between said pair of amplification lines, said first amplification circuit including first and second insulated gate field effect transistors which are connected in series between said first and second amplification lines, said first insulated field effect transistor having a gate connected to said first amplification line, said second insulated gate field effect transistor having a gate connected to said second amplification line, said first and second insulated gate field effect transistors being connected to a common connection node serving as a power supply end which is supplied with a voltage varying in level in accordance with an active or inactive state of said first amplification circuit;

a first equalization circuit for equalizing potentials of said first and second amplification lines;

a second amplification circuit for amplifying a potential difference between said first and second bit lines, said second amplification circuit including a third and fourth insulated gate field effect transistors which are connected in series between said first and second bit lines, said third insulated gate field effect transistor having a gate connected to said first bit line, said fourth insulated gate field effect transistor having a gate connected to said second bit line, said third and fourth insulated gate field effect transistors being connected to a common connection node serving as a power supply end which is supplied with a voltage varying in level in accordance with an active or inactive state of said second amplification circuit;

a second equalization circuit for equalizing potentials of said first and second bit lines;

a third amplification circuit for amplifying a potential difference between said third and fourth bit lines, said third amplification circuit including a fifth and sixth insulated gate field effect transistors which are connected in series between said third and fourth bit lines, said fifth insulated gate field effect transistor having a gate connected to said third bit line, said sixth insulated gate field effect transistor having a gate connected to said fourth bit line, said fifth and sixth insulated gate field effect transistors being connected to a common connection node serving as a power supply end which is supplied with a voltage varying in level in accordance with an active or inactive state of said third amplification circuit; and a third equalization circuit for equalizing potentials of said third and fourth bit lines.

18. A semiconductor memory device comprising:

a pair of column data lines including a first column data line having first and second resistive element portions, and a second column data line having third and fourth resistive element portions; a first memory cell array connected to a first end of each of said pair of column data lines;

a second memory cell array connected to a second end of each of said pair of column data lines;

a column gate connected to said first column data line between said first and second resistive element portions and to said second column data line between said third and fourth resistive element portions, said column gate being enabled/disabled in accordance with a column selection signal;

a first equalization circuit for equalizing a potential of a first portion of said first column data line between said first memory cell array and said first resistive element portion and a potential of a first portion of said second column data line between said first memory cell array and said third resistive element portion;

a first amplification circuit for amplifying a potential difference between the first portion of said first column data line and the first portion of said second column data line said first amplification circuit including first and second insulated gate field effect transistors which are connected in series between the first portion of said first column data line and the first portion of said second column data line, said first insulated gate field effect transistor having a gate connected to the first portion of said first column data line, said second insulated gate field effect transistor having a gate connected to the first portion of said second column data line, said first and second insulated gate field effect transistors being connected to a common connection node serving as a power supply end which is supplied with a voltage varying in level in accordance with an active or inactive state of said first amplification circuit;

a second equalization circuit for equalizing a potential of a second portion of said first column data line between said second memory cell array and said second resistive element portion and a potential of a second portion of said second column data line between said second memory cell array and said fourth resistive element portion;

a second amplification circuit for amplifying a potential difference between the second portion of said first column data line and the second portion of said second column data line, said second amplification circuit including third and fourth insulated gate field effect transistors which are connected in series between the second portion of said first column data line and the second portion of said second column data line, said third insulated gate field effect transistor having a gate connected to the second portion of said first column data line, said fourth insulated gate field effect transistor having a gate connected to the second portion of said second column data line, said third and fourth insulated gate field effect transistors being connected to a common connection node serving as a power supply end which is supplied with a voltage varying in level in accordance with an active or inactive state of said second amplification circuit;

a third equalization circuit for equalizing a potential of a third portion of said first column data line between said first and second resistive element portions and a potential of a third portion of said second column data line between said third and fourth resistive element portions; and a third amplification circuit for amplifying a potential difference between the third portion of said first column data line and the third portion of said second column data line, said third amplification circuit including a fifth and sixth insulated gate field effect transistors which are connected in series between the third portion of said first column data line and the third portion of said second column data line, said fifth insulated gate field effect transistor having a gate connected to the third portion of said first column data line, said sixth insulated gate field effect transistor having a gate connected to the third portion of said second column data line, said fifth and sixth insulated gate field effect transistors being connected to a common connection node serving as a power supply end which is supplied with a voltage varying in level in accordance with an active or inactive state of said third amplification circuit.

19. A device according to claim 16, wherein said first and second resistive elements constitute a first φt gate which is turned on when said first memory cell array is accessed, and said third and fourth resistive elements constitute a second φt gate which is turned on when said second memory cell array is accessed.

20. A device according to claim 17, wherein said first pair of resistive elements constitute a first φt gate which is turned on when said first memory cell array is accessed, and said second pair of resistive elements constitute a second φt gate which is turned on when said second memory cell array is accessed.

21. A device according to claim 18, wherein said first and second resistive element portions of said first column data line constitute a first φt gate which is turned on when said first memory cell array is accessed, and said third and fourth resistive element portions of said second column data line constitute a second φt gate which is turned on when said second memory cell array is accessed.

* * * * *